(12) United States Patent
Ravensbergen et al.

(10) Patent No.: US 8,052,289 B2
(45) Date of Patent: Nov. 8, 2011

(54) MIRROR ARRAY FOR LITHOGRAPHY

(75) Inventors: Marius Ravensbergen, Bergeljk (NL); Heine Melle Mulder, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 270 days.

(21) Appl. No.: 11/448,152

(22) Filed: Jun. 7, 2006

(65) Prior Publication Data

US 2007/0285638 A1 Dec. 13, 2007

(51) Int. Cl.
*G02B 7/195* (2006.01)
*G03B 27/52* (2006.01)

(52) U.S. Cl. .......................... 359/845; 355/30

(58) Field of Classification Search ............. 355/53, 355/67, 30; 359/877, 878, 845
See application file for complete search history.

(56) References Cited

U.S. PATENT DOCUMENTS

| | | | |
|---|---|---|---|
| 3,637,482 A * | 1/1972 | Vajda .................. | 204/229.5 |
| 6,285,488 B1 | 9/2001 | Sandstrom | |
| 6,737,662 B2 * | 5/2004 | Mulder et al. ............ | 250/548 |
| 6,781,739 B1 * | 8/2004 | Amm et al. ............... | 359/276 |
| 6,831,744 B2 * | 12/2004 | Masaki et al. ............ | 356/400 |
| 6,843,576 B2 | 1/2005 | Blakley | |
| 6,924,922 B2 | 8/2005 | Reboa | |
| 7,023,603 B2 | 4/2006 | Reboa | |
| 7,110,159 B2 | 9/2006 | Ljungblad | |
| 7,573,574 B2 | 8/2009 | Hinnen et al. | |
| 7,755,657 B2 | 7/2010 | Sandstrom et al. | |
| 2001/0021058 A1 * | 9/2001 | McClelland et al. ..... | 359/223 |
| 2002/0024714 A1 | 2/2002 | Sandstrom et al. | |
| 2002/0075553 A1 | 6/2002 | Orcutt | |
| 2002/0163625 A1 * | 11/2002 | Tabuchi et al. ............ | 353/31 |
| 2003/0202264 A1 * | 10/2003 | Weber et al. .............. | 359/877 |
| 2003/0202265 A1 * | 10/2003 | Reboa et al. .............. | 359/877 |
| 2004/0075522 A1 * | 4/2004 | Kato et al. ................ | 336/200 |
| 2004/0114117 A1 * | 6/2004 | Bleeker .................... | 355/53 |
| 2005/0024613 A1 * | 2/2005 | Bleeker .................... | 355/67 |
| 2005/0099611 A1 * | 5/2005 | Sogard ..................... | 355/30 |
| 2005/0128565 A1 | 6/2005 | Ljungblad | |
| 2005/0152017 A1 * | 7/2005 | Reboa ...................... | 359/251 |
| 2005/0236144 A1 * | 10/2005 | Takeuchi ................ | 165/104.33 |
| 2006/0017893 A1 | 1/2006 | Mertens et al. | |
| 2007/0165098 A1 | 7/2007 | Sandstrom et al. | |

FOREIGN PATENT DOCUMENTS

EP 0 866 352 A2 9/1998

(Continued)

OTHER PUBLICATIONS

Thomas L. Sounart, Terry A. Michalske, and Kevin R. Zavadil, Frequency-Dependent Electrostatic Actuation in Microfluidic MEMS, Feb. 2005, Journal of Microelectromechanical Systems, vol. 14, No. 1.*

(Continued)

*Primary Examiner* — Hung Henry Nguyen
*Assistant Examiner* — Steven H Whitesell Gordon
(74) *Attorney, Agent, or Firm* — Pillsbury Winthrop Shaw Pittman LLP

(57) ABSTRACT

A mirror array apparatus includes a carrier configured to support a plurality of individually adjustable reflective elements. At least one actuator is associated with each reflective element, the actuator being configured to adjust the orientation or position of the associated reflective element. The apparatus further includes a liquid in contact with at least a portion of the reflective elements.

14 Claims, 3 Drawing Sheets

FOREIGN PATENT DOCUMENTS

| | | |
|---|---|---|
| EP | 1 457 802 A1 | 9/2004 |
| JP | 2000-214397 | 8/2000 |
| JP | 2002-372790 | 12/2002 |
| JP | 2003-322807 | 11/2003 |
| JP | 2004-151723 | 5/2004 |
| JP | 2004-280106 | 10/2004 |
| JP | 2004-280107 | 10/2004 |
| JP | 2005-182037 | 7/2005 |
| JP | 2006-32956 | 2/2006 |
| WO | 2004/111701 | 12/2004 |
| WO | 2005/057291 | 6/2005 |

OTHER PUBLICATIONS

European Search Report issued for European Patent Application No. 07252194.1-2217, dated Aug. 8, 2007.

Taiwan Office Action dated Aug. 25, 2010 in related Taiwan patent application No. 096119766.

Japanese Office Action mailed Jan. 17, 2011 in related Japanese patent application No. 2007-144330.

Japanese Office Action for Japanese Patent application No. 2007-144330.

* cited by examiner

MIRROR ARRAY FOR LITHOGRAPHY

FIELD OF THE INVENTION

The present invention relates to a mirror array and to a mirror array for lithography.

BACKGROUND OF THE INVENTION

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion at once, and scanners, in which each target portion is irradiated by scanning the pattern through the radiation beam in a given direction (the "scanning" direction) while synchronously scanning the substrate parallel or anti-parallel to this direction.

A mirror array typically employs a matrix arrangement of small reflective elements (or mirrors), which are individually adjustable, for example tiltable about an axis (by an actuator), so as to apply a pattern to a reflected beam of radiation. Mirror arrays may alternatively be referred to as a "programmable mirror array", a "micromirror array" or an "active faceted mirror."

It should be appreciated that such mirror arrays have several uses and, in particular, may be utilized in lithographic apparatus. For example, it is known to utilize mirror arrays to form the patterning device of a lithographic apparatus (for example in a lithographic apparatus for use in the manufacture of flat panel displays).

More recently, the use of mirror arrays in the illumination system of a lithographic apparatus has been proposed. The illumination system of a lithographic apparatus is arranged to receive radiation from a source (for example a laser) and produce an radiation beam for illuminating an object (for example a patterning device). The illumination system shapes and controls the radiation beam to provide a beam with a desired spatial intensity distribution and angular intensity.

A conventional illumination system may comprise a diffractive optical element ("DOE") and a "zoom-axicon" apparatus (which is a device configured to adjust the intensity distribution at a pupil plane). Several disadvantages have been identified with such conventional illumination systems. For example, to produce the desired range of illumination settings the zoom-axicon module will generally have several (e.g. five or more) optical components, which can make it expensive to produce, particularly given the fact that several of the elements must be independently movable. A further problem is that the lenses of the axicon (which may for example comprise a zoom lens and two conical elements) represent a considerable thickness of lens material and a large number of surface interfaces such that transmission efficiency may be poor due to absorption, reflection, inefficient coatings, degradation effects and contamination. This problem is exacerbated by the demand for imaging ever smaller features at higher densities which requires the use of radiation with shorter wavelengths, such as 193, 157, 126 nm or even EUV (e.g. 5-20 nm). Thus, a mirror array based illumination system is desirable.

Mirror array based illumination systems are more flexible and are faster than the prior art combination of diffractive optical element and zoom-axicon. For example, changing an illumination mode generated using a prior art diffractive optical element requires several seconds, since the diffractive optical element must be replaced. The mirror array based illumination system allows the illumination mode to be changed more quickly. Furthermore, the prior art zoom-axicon can only make circularly symmetric changes to the spatial intensity, whereas the mirror array based illumination system does not have this limitation.

However, Applicants have recognized a number of problems associated with mirror arrays, particularly when used in lithography. Since the individual reflective elements of a typical mirror array are generally very small, for example a mirror array may comprise over a 1000 microscopic mirrors, the elements may be susceptible to damage during use. For example, heat generated by the radiation (that the mirrors are reflecting) may cause the reflective elements to be damaged by overheating. Such heat generation is, for example, particularly noticeable with the high optical power and short wavelengths used in deep UV and EUV applications. Furthermore, damage may be caused during movement of the reflective elements, for example by excessive oscillation of the reflective element following actuation.

SUMMARY OF THE INVENTION

It is, therefore, desirable to provide an alternate mirror array apparatus that may overcome, or mitigate, at least one of the disadvantages of the prior art.

According to an embodiment of the invention, there is provided a mirror array apparatus comprising: a carrier configured to support a plurality of individually adjustable reflective elements; at least one actuator associated with each reflective element, the actuator being configured to adjust the orientation or position of the associated reflective element relative to the carrier; and a liquid in contact with at least a portion of the reflective elements.

According to another embodiment of the invention, there is provided a method of cooling a mirror array apparatus, the apparatus comprising a plurality of individually adjustable reflective elements, the method comprising providing a liquid in direct thermal contact with at least a portion of the reflective elements.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

Patterning devices may be transmissive or reflective. Examples of patterning devices include masks, programmable mirror arrays (for example mirror arrays according to embodiments of the invention), and programmable LCD panels. Masks are well known in lithography, and include mask types such as binary, alternating phase-shift, and attenuated phase-shift, as well as various hybrid mask types.

The support supports, e.g. bears the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the radiation beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
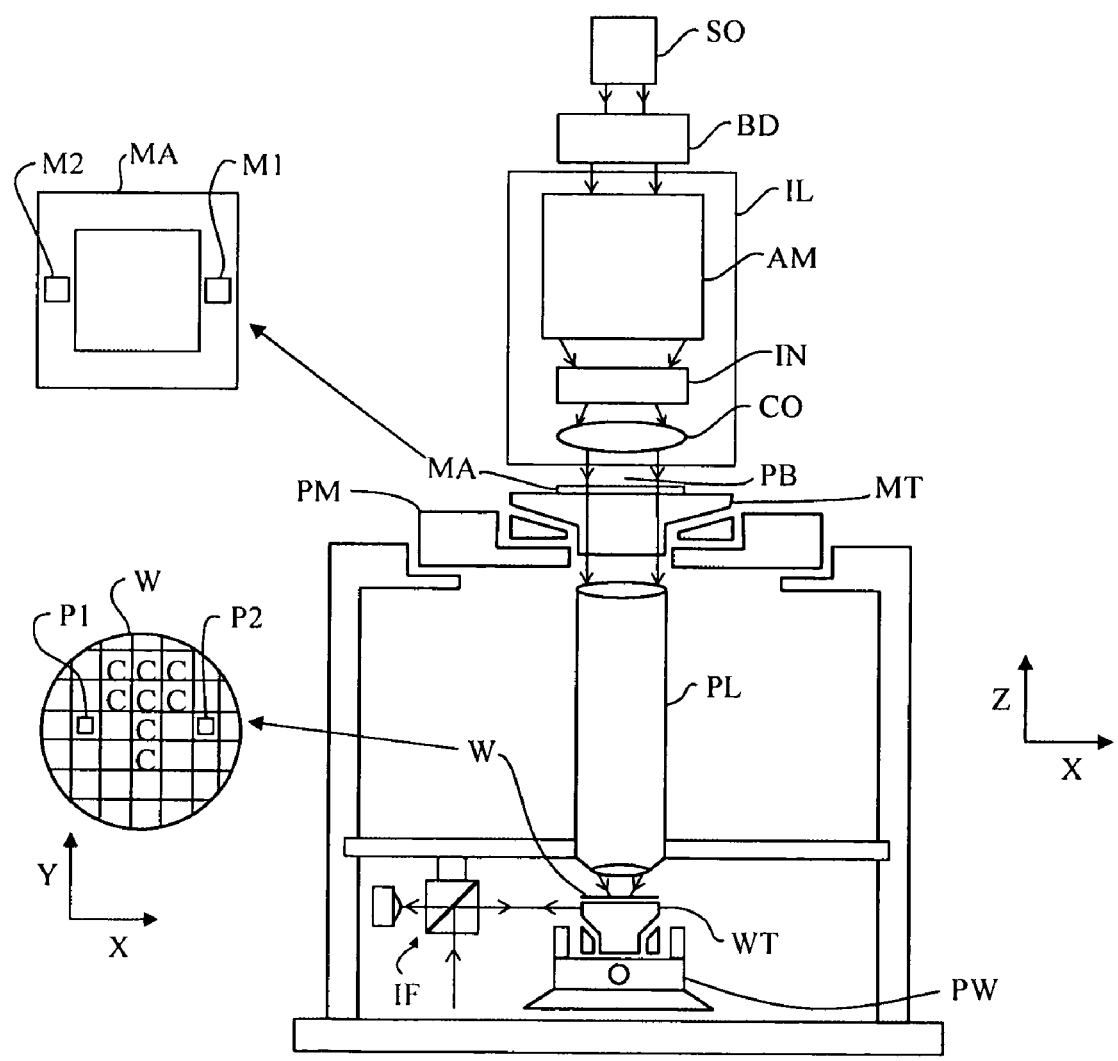
FIG. 1 depicts a lithographic apparatus according to an embodiment of the invention.

FIG. 1 schematically depicts a lithographic apparatus according to an embodiment of the invention. The apparatus comprises an illumination system (illuminator) IL configured to provide a radiation beam PB (e.g. UV radiation or EUV radiation). A first support (e.g. a mask table) MT is configured to support a patterning device (e.g. a mask) MA and is connected to a first positioning device PM configured to accurately position the patterning device with respect to a projection system ("lens") PL. A substrate table (e.g. a wafer table) WT is configured to hold a substrate (e.g. a resist-coated wafer) W and is connected to second positioning device PW configured to accurately position the substrate with respect to the projection system PL. The projection system (e.g. a refractive projection lens) PL is configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to herein).

The illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

As will be described in further detail below, the illuminator IL may comprise an adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the radiation beam PB, having a desired uniformity and intensity distribution in its cross-section.

The radiation beam PB is incident on the mask MA, which is held on the mask table MT. Having traversed the mask MA, the radiation beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
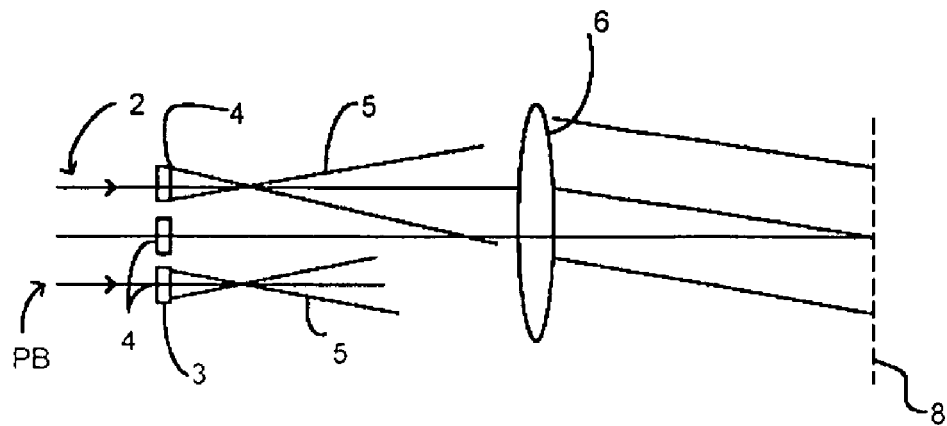
FIG. 2 depicts the transformation of an angular intensity distribution to a spatial intensity distribution according to a prior art arrangement.

FIG. 2 illustrates the principle of corresponding angular and spatial intensity distributions of the radiation beam PB. According to a prior-art arrangement, an adjusting device for setting the outer and/or inner radial extent (commonly referred to as σ-outer and σ-inner, respectively) comprise a diffractive optical element ("DOE") 3 with an array of micro-lenses 4. Each micro-lens 4 forms a divergent pencil 5 of rays. Each pencil 5 of rays corresponds to a part or sub-beam of the radiation beam which is incident at the DOE 3. The pencils 5 will be incident at focusing lens 6. In the back focal plane 8 of the lens 6, each pencil 5 corresponds to an illuminated area. The size of the area depends on the range of directions into which the rays of the pencil 5 propagate. If the range of directions is small, the size of the illuminated area in the back focal plane 8 is also small. Furthermore, all identical directions of the pencils 5, i.e. all rays which are parallel to each other, correspond to one and the same particular point in the back focal plane 8.

It is known to produce a spatial intensity distribution in a cross-sectional area of the radiation beam PB, in particular in a pupil plane, which has an annular shape. The inner radial extent which corresponds to the central area with an intensity of zero or close to zero, can be set by choosing an appropriate DOE 3. For example, all micro-lenses 4 can be oriented so that none of the pencils 5 of rays will be incident at the central area and will only be incident in the annular area (of course, in practice, there will be an intensity greater than zero in the central area, due to effects such as dispersion). By orienting the micro-lenses 4 into different directions, other spatial intensity distributions can be produced in the cross-sectional area, such as dipole or quadrupole illumination. However, the number of possible intensity distributions is limited and a change of the illumination setting requires time consuming replacement and/or re-orienting of micro-lenses.

Figure 3:
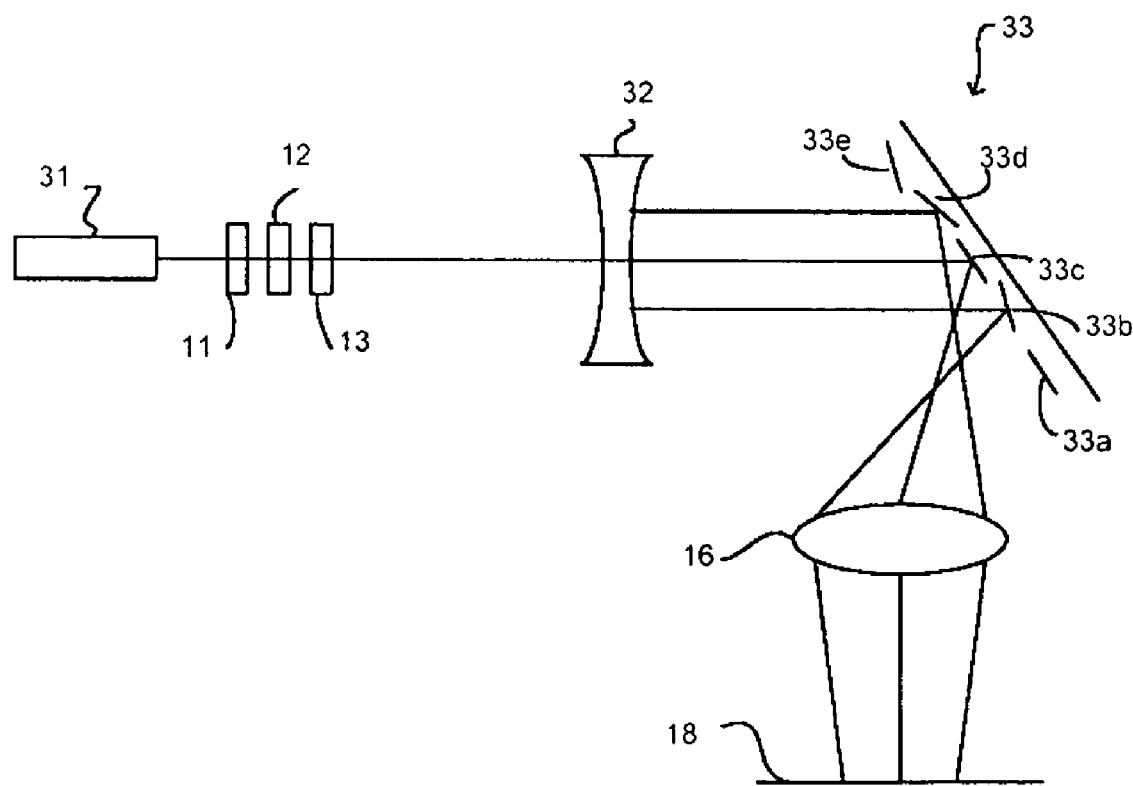
FIG. 3 depicts in more detail the radiation system which may utilize a mirror array in accordance with an embodiment of the invention.

FIG. 3 shows an alternate arrangement of the radiation system in which the illuminator comprises a mirror array 33, which may be a mirror array according to an embodiment of the present invention. A laser 31 outputs a relatively narrow, collimated beam which passes through shutters 11, 12, 13. It is then passed through beam divergence optics 32 which expand the beam to a size which corresponds to the size of a mirror array 33 of reflective elements 33a, 33b, 33c, 33d, 33e. Ideally, the beam divergence optics 32 should output a collimated beam; however, at the edges of the beam there may be a divergence difference. Preferably, the size of the expanded beam is sufficient that the beam is incident at all reflective elements 33a to 33e. In FIG. 3, by way of example, three sub-beams of the expanded beam are shown.

A first sub-beam is incident at reflective element 33b. Like the other reflective elements 33a, 33c to 33e of the array 33, the reflective element 33b can be controlled to adjust its orientation so that the sub-beam is reflected into a desired pre-determined direction. By re-directing optics 16, which may comprise a focusing lens, the sub-beam is re-directed so that it is incident at a desired point or small area in a cross-sectional plane 18 of the beam. The cross-sectional plane 18 may coincide with the pupil plane which acts as a virtual radiation source (as described above). The other sub-beams shown in FIG. 3 are reflected by the reflective elements 33c, 33d and re-directed by re-directing optics 16 so as to be incident at other points of plane 18. By controlling the orientations of the reflective elements 33a to 33e, almost any spatial intensity distribution in the cross-sectional plane 18 can be produced. For example, the mirror array 33 comprises 1152 (e.g. 32×36) mirrors and the orientation of each mirror can be adjusted separately.

It should be appreciated that while the illuminator described above is merely one possible application for the mirror array according to an embodiment of the invention, and in its broadest form the invention is not intended to be limited to this particular use. For example, the mirror array of the invention may be used as a patterning device in a lithographic apparatus.

Figure 4:
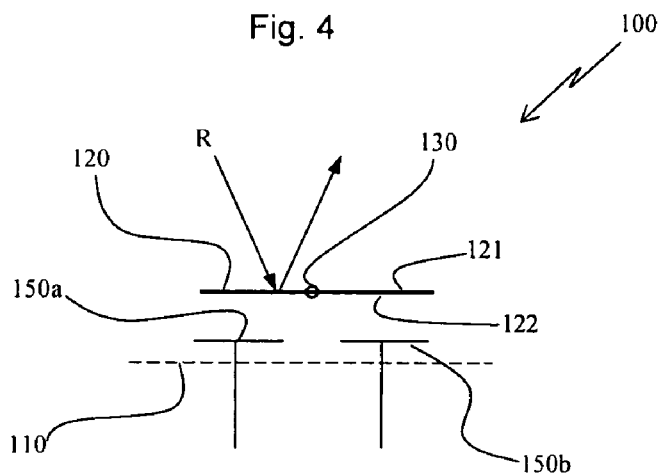
FIG. 4 depicts a cross-sectional view of a single reflective element of a mirror array apparatus.

FIG. 4 schematically represents a cross sectional view of a single reflective element of one type of mirror array apparatus 100. A carrier (or substrate) 110 is configured to support a plurality of individual reflective elements 120 (only one of which is shown in the figure). It will be appreciated that the number of reflective elements 120 forming a particular mirror array 100 may vary widely dependent upon the particular application. The mirror array 100 may, for example, comprise several hundred or more than a thousand microscopic mirrors, which may be provided on a single carrier 110. The carrier 110 may be formed of semiconductor material. It may alternatively be formed from any other suitable construction material, for example metal or glass. Metal or glass may be used for example in the case of a mirror array 100 which is constructed using a technology other than lithography, e.g. mini-mechanical construction.

Each reflective element 120 has a front side comprising a reflective surface. For example the front surface may comprise a mirror, a reflective coating or a layering of reflective optical coatings. Each reflective element 120 has a rectangular reflective surface area and a generally planar reflective surface. In general, however, the reflective element 120 can have any desired shape, for example a circular or hexagonal shape. Furthermore the reflective element may optionally have a non-planar or arcuate reflecting surface. The reflective elements 120 may be formed of any suitable material, for example silicon. The silicon, or other material, may be coated with other materials in order to achieve sufficient reflectivity. The mirrors may be made of other materials. For example, where mini-mechanical construction is used an optical material like ZERODUR® may be used, covered with a reflection coating.

The reflective element 120 is moveably connected to the carrier 110 by a suspension point 130, for example a hinge. The suspension point may be a resilient member so as to bias the reflective element 120 towards a particular orientation (for example so as to be substantially parallel to the plane of the carrier 110). The suspension point 130 may for example be a flexure or a spring. Alternatively the suspension point 130 may be formed from the same material as the mirror (e.g. silicon), in a strip which is sufficiently thin that it may bend and therefore allows the mirror to rotate. In the embodiment shown in FIG. 4 the reflective element 120 is rotatable, about a single suspension point 130, about an axis parallel to the plane of the carrier 110. In other embodiments each reflective element 120 may be arranged to be rotatable about more than one axis, for example two mutually perpendicular axis, each axis being parallel to the plane of the carrier 110.

For each reflective element 120 at least one actuator is provided on the carrier 110. In some embodiments (as shown in FIG. 4) each reflective element 120 may be associated with a pair of actuators 150a, 150b for rotation of the reflective element 120 about a single axis. The actuators may for example be positioned either side of the suspension point 130. In embodiments in which the reflective element 120 is rotatable about more than one axis, it will be appreciated that as many actuators per axis of rotation as desired may be provided.

The actuators 150a, 150b may take any suitable form and may depend upon the particular form of the reflective elements. For example the actuators 150a, 150b may comprise mechanical actuators (for example piezoelectric actuators which are mechanically connected to the reflective element 120). In some embodiments the actuators 150a, 150b may for example be electromagnetic actuators (that may selectively attract or repel a portion of the reflective element 120 upon application of an electrical current). In other embodiments the actuators 150a, 150b may for example comprise electrostatic actuators (that may selectively attract or repel a portion of the reflective element 120 upon application of an electrical current). It will be appreciated that each reflective element 120 has a rear side (generally facing the carrier 110) which is arranged to cooperate with the particular type of actuator being used.

Figure 5A:
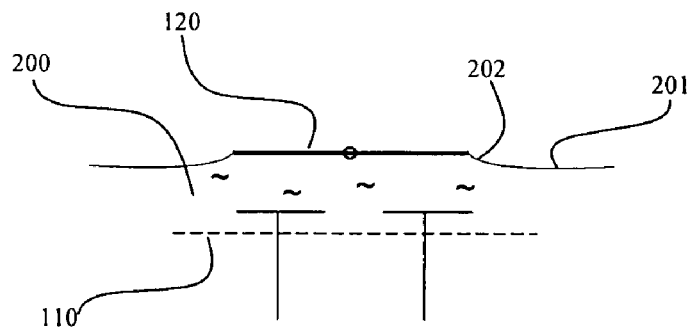
FIGS. 5A, 5B and 5C, depict cross-sectional views of a single reflective element of a mirror array apparatus in accordance with embodiments of the invention.

In an embodiment of the invention, as shown by FIG. 5A, the mirror array further comprises a liquid 200 arranged in contact with at least a portion of the reflective element 120. As will be explained in further detail below, the liquid 200 may for example be in direct thermal contact with a portion of the reflective element 120. The liquid may for example be arranged between the reflective element 120 and the carrier 110 as shown in FIG. 5A. Thus, the liquid 200 may be arranged in contact with substantially the entire rear surface 122 of the reflective elements 120. In order to avoid immersion of the outer edges of the reflective element upper surface 121 during rotation, the liquid 200 may be arranged such that its upper surface 201 lies at a slightly lower level than the plane of the reflective element 120 (i.e. when the plane of the reflective element is substantially parallel to the carrier 110). By ensuring that the difference in height is sufficiently small, surface tension of the liquid 200 will ensure that the regions 202 adjacent to the outer edges of reflective element meet the edge of the reflective element 120. Therefore, it may be possible to ensure that the liquid 200 is arranged in contact with the lower surface 122 of the reflective element 120.

Figure 5B:
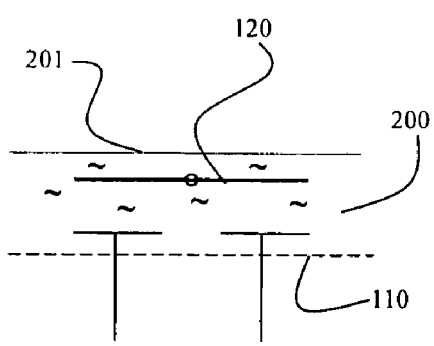

In an alternative embodiment, as shown in FIG. 5B, the reflective element 120 may be entirely immersed within the liquid 200. Thus, the entire surface area (i.e. both the upper surface 121 and the lower surface 122) of the reflective element 120 is in contact with the liquid 200. It will be appreciated that full immersion of the reflective element may avoid the surface tension of the liquid 200 inhibiting or interfering with the movement of the reflective element 120.

In use the liquid 200 assists cooling of the reflective element 120 (which may be heated by the high light intensity of the electromagnetic radiation it is reflecting). The liquid 200 enables heat dissipation from the reflective element 120.

Furthermore, since the liquid 200 will have a significant higher viscosity than air a damping effect will be provided upon movement of the reflective element 120. It will be appreciated that improved damping may help to avoid damage to the reflective elements 120 during movement and may also be used to improve the accuracy of the positioning of the reflective elements. In some embodiments this may also for example enable the mirror array 100 to be operated without, or with a reduced, need for position sensing and/or an associated positioning servo to correct the position of the reflective element 120.

Figure 5C:
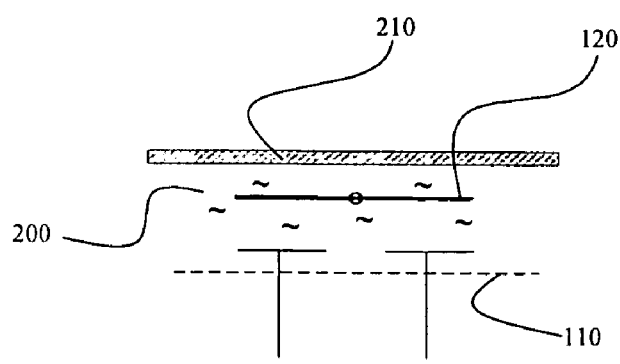

In an alternate embodiment shown in FIG. 5C, the mirror array may further comprise a cover 210 enclosing the liquid 200. For example the cover may be arranged substantially parallel to, and spaced apart from, the carrier 110. Accordingly, the cover and carrier may define an enclosure for both the liquid 200 and the reflective elements 120. The cover 210 may for example be sufficiently spaced from the carrier 110 to accommodate movement of the reflector elements 120 therebetween. It will be appreciated that the cover 210 should be formed of a material that is transparent to the particular wavelength of electromagnetic radiation being used. For example the cover 210 may be formed from quartz, borosilicate or $CaF_2$. Where necessary (e.g. when using $CaF_2$), the cover 210 may be coated to prevent damage from the liquid 200. The cover may be coated with an antireflective coating.

In some embodiments the liquid 200 may itself at least partially support the cover 210. For example the liquid 200 may be slightly pressurised so as to support the weight of the cover 210 and help maintain the cover in a flat orientation.

It should be appreciated that the liquid 200 may be any liquid which is suitable for immersion lithography (at the particular wavelength of radiation in use). For example, the liquid 200 may be aluminium chloride, hydrogen phosphate (or phosphoric acid) sodium sulphate or water.

The liquid 200 may be circulated away from the reflective element(s) 120 in order to enhance the heat transfer away from the reflective elements 120. The liquid may for example be circulated away from the reflective region of the mirror array 100. For example the liquid may be circulated to a thermal control unit. It should be appreciated that there are several forms of thermal control units that may be suitable for cooling the liquid when circulated away from the mirror array. The thermal control unit may for example be a passive heat dissipation device (for example a heat sink or radiator). Alternatively, the thermal control unit may be an active system arranged to regulate the temperature of the liquid. The thermal control unit may for example be thermostatically controlled. In some embodiments the thermal control unit may for example comprise a refrigeration circuit or an electrothermal device (for example a peltier effect device).

It should be appreciated that the circulation of liquid 200 away from the reflective element(s) 120 must be carried out at a sufficiently low velocity such that the position of the reflective element(s) 120 is not disturbed nor their movement impeded. Additionally minimizing the velocity of the circulation will also help to avoid or prevent damage to the reflective element(s) 120.

Water may for example be chosen as the liquid 200 in some embodiments since water has a relatively high dielectric constant (of approximately 80). The increased dielectric constant of a liquid 200, in comparison to air, is desirable when an electrostatic actuator arrangement is used for the actuators 150a, 150b since it enables the actuator voltages to be reduced. The increased dielectric constant may also be desirable when other forms of actuator are used, for example a piezoelectric actuator arrangement. The piezoelectric actuator (or other actuator) may have position feedback which is capacitive, such feedback being enhanced by the liquid 200.

When using a liquid, for example water, with an electrostatic actuator arrangement there is a risk of electrolysis of the liquid or that the electrodes of the actuator may become polarised (for example by deposition of hydrogen liberated from the water). In order to avoid this effect the electrostatic actuators may be driven using an alternating current. The use of an alternating current does not adversely effect the operation of the actuators 150a, 150b since the polarity of the current is not relevant to the force induced on the reflecting element 120 (in fact the force is proportional to the square of the voltage). In order to further avoid or minimize any adverse effects from the use of alternating currents, for example oscillation of the reflective element 120, the frequency of the alternating current may be chosen to have a sufficiently high frequency (for example a frequency above the Eigen modes of the reflective element 120). The wave shape of the alternating current may also be suitably chosen to minimize any adverse effects, for example the wave shape may be a square wave.

The increased electrical capacity between the reflective element 120 and the carrier 110 (provided by the presence of the liquid 200) also provides that the capacitance sensors may be more readily used to measure the position and/or orientation of the reflective element. Accordingly, the mirror array 100 may further comprise at least one capacitive sensor associated with each reflective element 120 for sensing the orientation or position of the reflective element. The capacitive sensor may for example be used in a feedback control system to ensure accurate positioning of the reflective element 120.

While specific embodiments of the invention have been described above, it will be appreciated that the invention may be practiced otherwise than as described. The description is not intended to limit the invention.

For example, while the embodiment described above utilize individually rotatable reflective elements, it should be appreciated that there are other forms of mirror array (comprising a plurality of individually adjustable reflective elements) that will be within the scope of the invention. For example, the mirror array may comprise a plurality of reflective elements which are arranged to be linearly displaceable.

One alternative form of mirror array apparatus, which may be used in embodiments of the present invention, comprises a plurality of individually adjustable reflective elements in the form of movable ribbon-like structures. The array may be addressed by moving individual elements such that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface.

What is claimed is:

1. A mirror array apparatus, comprising:
   a carrier configured to support a plurality of individually adjustable reflective elements;
   a capacitance sensor configured to measure an orientation and/or position of one or more reflective elements of the plurality of reflective elements;
   an actuator associated with each reflective element, the actuator being configured to adjust the orientation and/or position of the associated reflective element relative to the carrier in response to the measured orientation and/or position of the associated reflective element by the capacitance sensor; and
   a liquid in direct physical contact with a reflective side of a movable portion of the reflective elements, substantially all of the liquid having a dielectric constant of about 80 or more, and the liquid being in direct physical contact with and between the one or more reflective elements and the capacitance sensor,
   wherein the mirror array apparatus is configured to, during projection of a beam onto the reflective elements, circulate away the liquid in direct physical contact with the reflective side of the movable portion from the reflective elements, whether the reflective elements are stationary or moving, to a thermal control device to passively or actively dissipate heat from the liquid and to return the heat dissipated liquid to the reflective elements.

2. The apparatus of claim 1, wherein each reflective element is rotatable about an axis substantially parallel to a plane of the carrier.

3. The apparatus of claim 1, wherein each reflective element is rotatable about two axes, both axes being substantially parallel to a plane of the carrier.

4. The apparatus of claim 1, wherein each reflective element is supported on the carrier by a resilient member.

5. The apparatus of claim 1, wherein each reflective element has a front side, comprising a reflective surface, and a rear side, configured to cooperate with the actuator, the liquid being arranged in contact with at least a portion of the rear side of the reflective elements.

6. The apparatus of claim 1, wherein the liquid is arranged between the reflective element and the carrier.

7. The apparatus of claim 1, wherein the liquid surrounds the reflective elements.

8. The apparatus of claim 1, further comprising a cover arranged substantially parallel to, and spaced apart from, the carrier.

9. The apparatus of claim 1, wherein the liquid is water.

10. The apparatus of claim 1, wherein the actuator comprises an electrostatic actuator.

11. The apparatus of claim 10, wherein the actuator is driven by an alternating current.

12. The apparatus of claim 11, wherein the ac current comprises a high-frequency square-wave alternating current.

13. A lithographic apparatus, comprising:
- an illumination system configured to provide a radiation beam;
- a support configured to support a patterning device, the patterning device being configured to impart the radiation beam with a pattern in its cross-section;
- a substrate table configured to hold a substrate;
- a projection system configured to project the patterned beam onto a target portion of the substrate; and
- a mirror array apparatus comprising
    - a carrier configured to support a plurality of individually adjustable reflective elements;
    - a capacitance sensor configured to measure an orientation and/or position of one or more reflective elements of the plurality of reflective elements;
    - an actuator associated with each reflective element, the actuator being configured to adjust the orientation and/or position of the associated reflective element relative to the carrier in response to the measured orientation and/or position of the associated reflective element by the capacitance sensor; and
    - a liquid in direct physical contact with a reflective side of a movable portion of the reflective elements, substantially all of the liquid having a dielectric constant of about 80 or more, and the liquid being in direct physical contact with and between the one or more reflective elements and the capacitance sensor,
    - wherein the mirror array apparatus is configured to, during projection of a beam of radiation onto the reflective elements, circulate away the liquid in direct physical contact with the reflective side of the movable portion from the reflective elements, whether the reflective elements are stationary or moving, to a thermal control device to passively or actively dissipate heat from the liquid and to return the heat dissipated liquid to the reflective elements.

14. A method of cooling a mirror array apparatus, the apparatus comprising a plurality of individually adjustable reflective elements, the method comprising providing a liquid, substantially all of the liquid having a dielectric constant of about 80 or more, in direct physical and thermal contact with at least a reflective side of a movable portion of the reflective elements and in direct physical contact with and between one or more reflective elements of the plurality of reflective elements and a capacitance sensor, measuring an orientation and/or position of the one or more reflective elements using the capacitive sensor, adjusting the orientation and/or position of the one or more reflective elements based on the measured orientation and/or position, and during projection of a beam onto the reflective elements, circulating the liquid in direct physical and thermal contact with at least the reflective side of the movable portion away from the reflective elements, whether the reflective elements are stationary or moving, to a thermal control device to passively or actively dissipate heat from the liquid and returning the heat dissipated liquid to the reflective elements.

* * * * *